United States Patent [19]

Sashital

[11] Patent Number: 4,534,822
[45] Date of Patent: Aug. 13, 1985

[54] METHOD OF SYNTHESIZING THIN, SINGLE CRYSTAL LAYERS OF SILVER THIOGALLATE (AGGAS$_2$)

[75] Inventor: Sanat K. Sashital, Thousand Oaks, Calif.

[73] Assignee: Hughes Aircraft Company, El Segundo, Calif.

[21] Appl. No.: 605,363

[22] Filed: Apr. 30, 1984

[51] Int. Cl.$^3$ .............................................. C30B 19/02
[52] U.S. Cl. ........................... 156/624; 156/DIG. 101
[58] Field of Search ................ 148/171; 156/621, 622, 156/624, DIG. 70, DIG. 72, DIG. 92, DIG. 101; 423/511; 252/364

[56] References Cited

U.S. PATENT DOCUMENTS

| | | | |
|---|---|---|---|
| 3,902,860 | 9/1975 | Akai et al. | 156/609 |
| 4,077,817 | 3/1978 | Bellavance | 156/624 X |
| 4,197,008 | 4/1980 | Pinnow et al. | 350/393 X |
| 4,376,659 | 3/1983 | Castro | 156/DIG. 72 X |

OTHER PUBLICATIONS

Kamath et al., Large-Area High-Efficiency (Al-Ga)As-GaAs Solar Cells, IEEE Transactions on Electron Devices, vol. ED-24, No. 4, Apr. 1977, pp. 473-475.

Chedzey et al., A Study of the Melt Growth of Single-Crystal Thiogallates, J. Phys. D.: Appl. Phys., 1971, vol. 4, pp. 1320-1324.

Primary Examiner—Hiram H. Bernstein
Assistant Examiner—Michael S. Gzybowski
Attorney, Agent, or Firm—John A. Sarjeant; A. W. Karambelas

[57] ABSTRACT

A method of growing a single crystal layer of silver thiogallate having a maximum thickness of 50 micrometers. This crystal is of a high purity having a higher degree of crystalline perfection than the substrate on which it is grown. The crystal is grown epitaxially from a solution of silver thiogallate in a solvent of either antimony sulfide or lead sulfide. The solution is prepared by heating a mixture of the materials (solid silver thiogallate in molten solvent) slowly at a rate of, for example, 3° to 5° C. per minute until the mixture reaches a temperature about 10° C. above the liquidus, and maintaining this temperature for 16 hours or more. The above referenced solution is then gradually cooled at a rate of, for example, 1° C. per minute to the temperature at which crystal growth is to be initiated. At this temperature a polished single crystal substrate of a material which has an appropriate lattice relationship with silver thiogallate is dipped into the molten solution. The solution and substrate are then cooled at a slow rate of, for example, 0.05° C. per minute over the temperature range within which crystal growth is to occur. During this cooling, the substrate is rotated in the melt. On obtaining the desired thickness of the epitaxially-grown single crystal layer, the substrate is withdrawn from the solution.

14 Claims, 3 Drawing Figures

METHOD OF SYNTHESIZING THIN, SINGLE CRYSTAL LAYERS OF SILVER THIOGALLATE (AGGAS$_2$)

RIGHTS OF THE UNITED STATES GOVERNMENT

The Government has rights in this invention pursuant to Contract No. F04701-76-C-0174, awarded by the Department of the Air Force.

BACKGROUND OF THE INVENTION

1. Field of the Invention

This invention relates to a method of synthesizing a highly pure, single crystal of silver thiogallate (AgGaS$_2$) and particularly to such a crystal epitaxially grown from a solution of silver thiogallate dissolved in antimony sulfide (Sb$_2$S$_3$) or lead sulfide (PbS).

2. Description of the Prior Art

Space Age electronics has resulted in the development of a wide variety of advanced electronic components, including devices known as electro-optic tunable filters. U.S. Pat. Nos. 4,197,008 and 4,240,696 are illustrative of such devices. Various semiconductor materials have been suggested for use in such devices, including silver thiogallate. U.S. Pat. No. 4,197,008 discloses such a device using silver thiogallate crystalline material. This crystalline material presently is only available as large single crystals which must be cut and ground to thickness of about 50 micrometers for use in electro-optical tunable filters. It would, however, be desirable if the crystal were considerably thinner. But the minimum thickness of this crystal that can be obtained using grinding techniques is about 50 micrometers.

SUMMARY OF THE INVENTION

In accordance with the invention, a method is provided for making single crystal layers of silver thiogallate, having a thickness less than 50 micrometers. Preferably, the thickness of the crystal of this invention ranges between 8 and 25 micrometers. This method is based upon epitaxially growing the crystal on a suitable substrate from a solvent of antimony sulfide or lead sulfide in which the silver thiogallate is dissolved. Epitaxial crystal growth is the well-known phenomenon whereby a crystal will grow on a substrate and assume a well-defined crystalline orientation with respect to the substrate. A suitable substrate is a seed crystal in the form of a compound comprising a I—III—VI$_2$ chemical composition and having a substantially chalcopyrite structure, such as silver thiogallate. When this seed crystal substrate is dipped into a molten solution of the silver thiogallate in either antimony sulfide or lead sulfide, and then the molten solution slowly cooled, there is formed on the exterior surface of the substrate a thin layer of a single crystal of silver thiogallate.

According to this invention, the composition of the molten solution may vary widely. For antimony sulfide solutions, the silver thiogallate is present in an amount ranging between about 15 and about 95 mole %. For lead sulfide solutions, the silver thiogallate is present in an amount ranging between about 50 and about 95 mole %. For antimony sulfide solutions, during crystal growth, the temperature ranges between about 510° and about 975° C. For lead sulfide solutions, during crystal growth, the temperature ranges between about 750° and about 985° C. The cooling rate for both the antimony sulfide and lead sulfide solutions ranges between about 0.03° and about 0.5° C. per minute.

BRIEF DESCRIPTION OF THE DRAWINGS

The preferred embodiments of this invention will be described in detail below in connection with the accompanying drawing, in which.

DETAILED DESCRIPTION OF THE INVENTION

GENERAL

In accordance with the invention, two solvents have been found suitable for growing silver thiogallate by liquid phase epitaxy, namely, antimony sulfide and lead sulfide. In order to determine what conditions would be required to grow the crystal, it has been necessary to prepare temperature-composition phase equilibrium diagrams for both the antimony sulfide-silver thiogallate system and the lead sulfide-silver thiogallate system, since neither of these diagrams is available in the published literature. These phase diagrams, shown as FIGS. 1 and 2, have been generated using differential thermal analysis (DTA) and X-ray diffraction analysis by the disappearing phase method for the entire composition ranges of 0 to 100 mole percent silver thiogallate.

Figure 1:
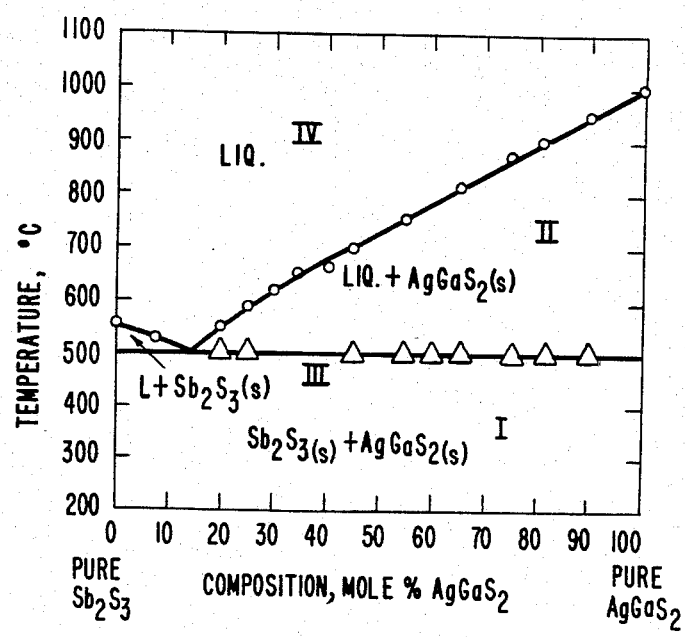
FIG. 1 is a temperature-composition phase equilibrium diagram for the silver thiogallate-antimony sulfide system.

Referring to FIG. 1, the antimony sulfide-silver thiogallate system is shown. X-ray analysis on samples quenched from high temperatures show the existence of four regions. I: below 495±2° C. AgGaS$_2$ (solid)+Sb$_2$S$_3$ (solid); II: liquid+AgGaS$_2$ (solid) for AgGaS$_2$>about 13.5 mole %; III: liquid+Sb$_2$S$_3$ (solid) for AgGaS$_2$<about 13.5 mole %; and IV: liquid for temperatures above the liquidus determined by DTA. Extrapolation of the two experimentally determined liquidus branches yields a eutectic composition of about 13 mole % AgGaS (m.p. 495±2° C.). Due to large supercooling (30° t0 40° C.) even with a slow cooling rate (2° C./min), transition temperatures from exothermic (cooling) DTA curves could not be used for phase field boundary determination. However, a one-to-one correspondence for the same transitions between exothermic and endothermic peaks has been observed. The data points of FIG. 1 are those from endothermic (heating) curves and, for any given composition, were reproducible to within ±4° C.

Figure 2:
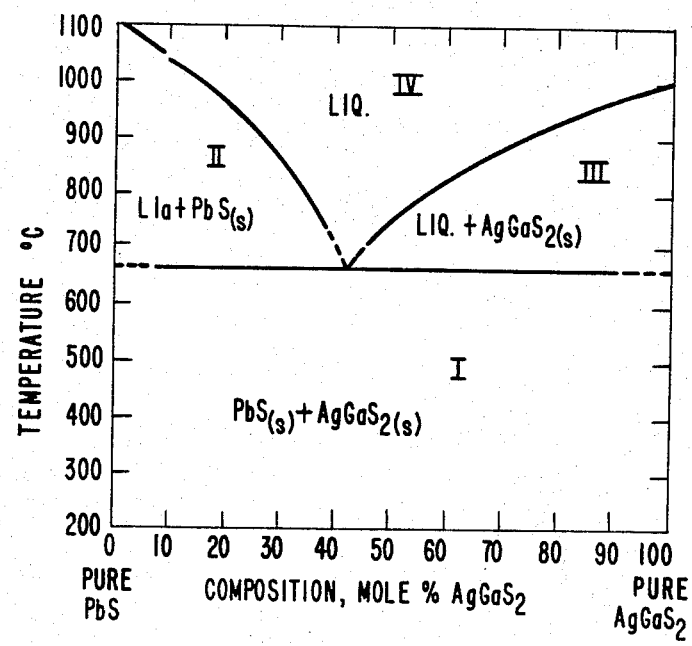
FIG. 2 is a temperature-composition phase equilibrium diagram for the silver thiogallate-lead sulfide system.

FIG. 2 shows the temperature-composition phase equilibrium diagram for the lead sulfide-silver thiogallate system. The different phase fields and boundaries were determined in the same manner as for the Sb$_2$S$_3$—AgGaS$_2$ system. X-ray analysis on samples quenched from high temperatures show the existence of four regions. I: below 670±4° C. PbS (solid)+AgGaS$_2$ (solid); II: liquid+PbS (solid) for AgGaS$_2$<about 42.5 mole %; III: liquid+AgGaS$_2$ (solid) for AgGaS$_2$>about 42.5 mole %; IV: liquid for temperatures above the liquidus determined by DTA. The eutectic composition occurs at 42.5 mole % AgGaS$_2$ and melts at 665±2° C.

The liquidus referred to above occurs when the entire mass of material turns liquid, and is represented by the boundary line separating the regions marked liquid/solid (II,III) and liquid mixtures (IV). At the liquidus temperature for any given composition, the solid silver thiogallate and solvent are both completely transformed into liquid. The reverse is also true. If a solution of the liquid is cooled from above the liquidus in the liquidus zone, thereby decreasing its temperature below the boundary, the silver thiogallate will crystallize from the solution. In such a system, if a substrate or seed crystal having an appropriate proper lattice parameter relationship with silver thiogallate is inserted into the molten solution at a temperature below the liquidus temperature, and the solution is allowed to cool slowly, the substrate serves as a nucleus for crystal growth. Examples of seed crystals having appropriate lattice parameters are compounds selected from a group of compounds comprising a I—III—VI$_2$ chemical composition and having a substantially chalcopyrite structure. Examples include $AgGaS_2$ and $AgAlS_2$.

Crystallization proceeds in the form of an epitaxial layer on the surface of the substrate. Typically, the cooling rate is 0.05° C. per minute. The optimum growth rate for antimony sulfide is 0.12 micrometers/minute. The optimum growth rate for lead sulfide is 0.08 micrometers/minute. As suggested by both FIGS. 1 and 2, the crystal structure of the silver thiogallate remains the same with temperature change until it becomes a liquid.

PREPARATION OF STARTING MATERIALS

In order to form the single crystal of silver thiogallate of the desired purity, all starting materials, silver, gallium, lead, antimony and sulfur were 99.999% pure.

The antimony sulfide and lead sulfide were prepared as follows: Each was synthesized by reacting molten antimony or molten lead, as the case may be, with sulfur vapors. Stoichiometric quantities of the metals of the antimony or lead, together with a slight sulfur excess (0.5 mole %), were reacted in an evacuated sealed quartz tube in a two-zone furnace. For 200 gram quantities, five days reaction time was adequate. Completion of the reaction was ascertained by performing differential thermal analysis (DTA) and X-ray diffraction on several randomly selected crystallites from each reacted compound. The lattice parameters and melting points were verified to be almost identical with those listed in standard handbooks for the pure compound.

The silver thiogallate was prepared in a similar manner by reacting silver gallium alloys with sulfur vapors. Prior to reaction, the molten silver gallium alloys were equilibrated at 745° C. in flowing hydrogen for at least eight hours for reduction of any surface oxides. The reacted silver gallium sulfide polycrystalline charge was then four-pass zone-refined for removal of any small quantities of second phase ($Ag_9GaS_6$ or $Ag_2Ga_{10}S_{31}$) precipitates.

The solution from which the crystal of this invention is grown was prepared by mixing antimony sulfide or lead sulfide, as the case may be, and silver thiogallate powders (up to a total of 100 milligrams) in appropriate molar quantity. Mixtures were sealed in evacuated quartz ampoules, heated to 1000° C., and equilibrated for at least ten hours. After cooling to room temperature, the samples were crushed, ground, and again loaded into quartz ampoules and sealed at $10^{-7}$ Torr vacuum.

The seed crystal was obtained from bulk silver thiogallate single crystal boules by cutting, grinding and fine polishing the cut surfaces. A seed crystal having dimensions of 1 cm×1 cm×0.15 cm was so formed. The square platelet substrate was oriented to within 1° using X-ray Laue spots to have {100} oriented large surfaces for epitaxial growth. Substrates for epitaxial growth were chosen to have a minimum of microcracks, {112} twin-faults, and other growth defects. The substrate was de-greased ultrasonically in warm Transene marketed by the Transene Company of Rowley, Mass. This was done at 50° C. followed by ultrasonic cleaning in methanol and then the substrate was loaded into a high purity graphite substrate holder.

METHOD OF CRYSTAL GROWTH

Figure 3:
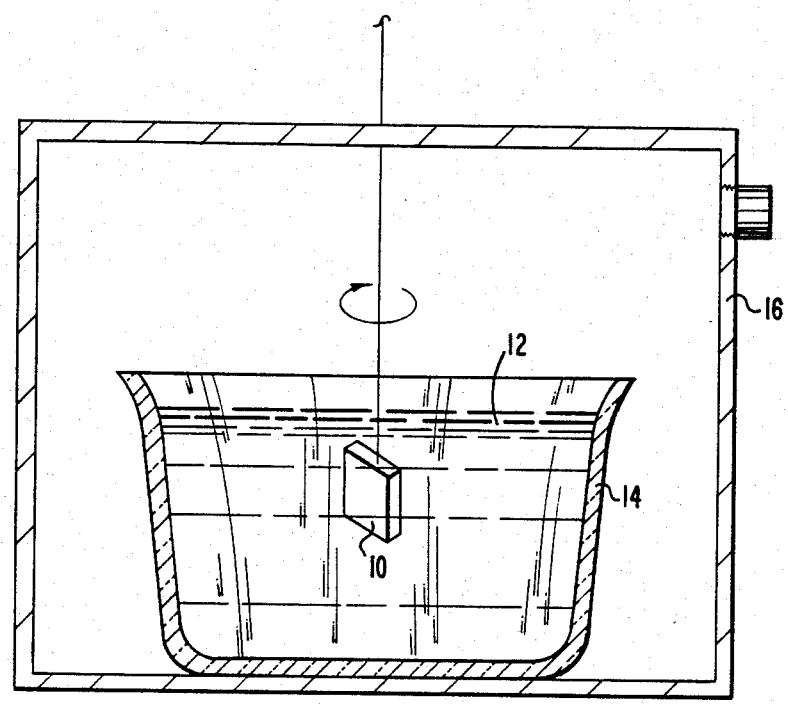
FIG. 3 is a schematic drawing illustrating the method of growing the single crystal layer of silver thiogallate on a seed crystal.

The method for growing the crystal is schematically shown in FIG. 3. This process in its simplest form consists of vertically dipping the silver thiogallate substrate 10 into a molten solution 12 of the silver thiogallate in either antimony sulfide or lead sulfide and then cooling the solution slowly. The detailed description of the apparatus employed is found in a paper by G. S. Kamath, J. Ewan, R. C. Knechtli, *IEEE Transactions on Electron Devices*, Vol. ED-24, No. 4, pages 473–75 (1977).

The silver thiogallate and the desired solvent in the desired molar ratio were loaded into a clean quartz crucible 14. The growth chamber 16 in which the crucible 14 was contained was evacuated to $10^{-6}$ Torr and then filled with pure argon at 5 psi above atmosphere. The crucible was equilibrated at 10° C. above the liquidus for the particular composition for at least 16 hours prior to any epitaxial growth. An isothermal zone within the chamber 16 of nearly five inches was produced to include the entire height of the solution melt 12 of nearly three inches. The temperature uniformity within the solution melt 12 was monitored to ±0.2° C. and the solution was cooled at a precisely controlled rate of 0.03° to 0.5° C./min, depending on the particular composition. This was achieved by an external microprocessor-based temperature control (not shown) of the main furnace (not shown). Prior to the growth of the crystal, the substrate 10 was equilibrated at the temperature of the solution 12 at a height of one inch above the melt. During solution cooling, the substrate 10 was rotated in the solution 12 at a controlled rate of 4 to 10 rpm. This kept the solution 12 homogenized.

On completion of the epitaxial growth, the substrate 10 was withdrawn from the solution 12 instantaneously and was cooled very gradually (at about 10° C./min) to avoid thermal shocks in cooling to room temperature. On removal from the reaction chamber, any excess solidified solution adhering to the crystal layer/substrate was chemically removed. With antimony sulfide, this was done by immersion into $NaS_x(x=2-4)$ aqueous solution. With lead sulfide, nitric acid (80% by volume in water) was used.

High solution viscosity was, at times, seen to cause fracture and cracking of the substrates. Adherent viscous solution layers solidify on cooling to room temperature to produce stress in the substrate due to differential thermal contraction. This stress may be large enough to cause fracture, and fracture was observed with large residual solution masses on substrates with an abundance of {112} growth twins. The fracture and cracking was severe in the region of twin faults on the substrate. High viscosity is also expected to have an adverse effect on growth rates and layer morphology.

As suggested by the phase diagrams of FIGS. 1 and 2, a fairly large composition and temperature range is available, in principle, for growth of the silver thiogallate crystal from solution. For antimony sulfide solutions, this extends from slightly greater than about 15 to about 95 mole % silver thiogallate, corresponding from about 510° to 975° C. For lead sulfide solutions, the composition range is from about 50 to 95 mole % silver thiogallate, corresponding from about 750° to 985° C. In practice, a limited part of this composition is of practical use for the following reasons.

The $Sb_2S_3$—$AgGaS_2$ or PbS—$AgGaS_2$ liquids may be expected to behave as normal solutions and lower their viscosity exponentially with increasing temperature. Such lowered viscosity could be used to advantage by growth at high temperatures. However, the higher the solution temperature, the higher will be the vapor pressures of the solute ($AgGaS_2$) and the solvent ($Sb_2S_3$ or PbS) and the greater the tendency of the species from the solution to escape from the melt, condense on the cooler portions of the crystal growth apparatus, and effectively be lost for the crystal growth process. At low solution temperatures, on the other hand, growth is hampered by increased viscosity. For antimony sulfide solutions, the optimum range of solution composition is from about 30 to 60 mole % silver thiogallate (temperature range of about 600° to 950° C.). For lead sulfide solutions, the optimum range of solution composition is relatively narrow, from about 60 to 70 mole % silver thiogallate (temperature range of about 810° to 900° C.).

In the composition range stated above, optimum conditions for good quality epitaxial growth using antimony sulfide as the solvent were:
  Solution composition: 45 mole % $AgGaS_2$
  Growth temperature: 575°–675° C.
  Solution cooling rate: 0.04° C./min
  Substrate rotation rate: 4 rpm.

Epilayer growth starts as planar, smooth, and essentially featureless, but breaks down beyond a certain minimum thickness, and {112} bounded facets and corrugations begin to develop on the {100} growth surface. For layers grown from antimony sulfide solutions, the thickness for onset of faceting was nearly 14 micrometers.

On completion of epitaxial growth, the epilayer/substrates were treated in $NaS_x$ (x=2–4) solutions for removal of the adherent, solidified solution layer. The epilayer/substrates were sectioned and polished for photomicroscopic examination of morphological features and epilayer thickness measurements. Growth rate under these conditions was 0.12 micrometers/min. Up to nearly 12 micrometers thickness, epilayer surfaces were seen to be essentially featureless, flat, and of uniform thickness to within ±0.2 micrometers. For layers of thickness greater than 14 micrometers, faceting was seen to occur on the {100} growth surfaces. The bounding faces of such facets were determined to be {112} surfaces by use of X-ray Laue spots. It appears that epitaxial growth rates on {112} surfaces are comparable, albeit much smaller than those on {100} surfaces. It was observed that considerable supersaturation, 24° to 40° C. below the solution liquidus temperature, was required to initiate epigrowth without etchback of the substrates.

The optimum composition range for epitaxial growth with lead sulfide as stated above is from about 60 to about 70 mole % silver thiogallate. Even within this range, the solutions were seen to be much more viscous than the usable antimony sulfide solutions, as judged by the resistance to substrate rotation in the melt. Optimum growth conditions within this composition range were:
  Solution composition: 65 mole % $AgGaS_2$
  Growth temperature: 825°–845° C.
  Solution cooling rate: 0.05° C./min
  Substrate rotation rate: 4 rpm.

During growth, a part of the substrate was masked by a high purity graphite mask such that only a part of the substrate surface was exposed to the solution. This yielded a well-defined epilayer edge at the boundary between the masked and exposed surfaces of the substrate. Under these conditions, the growth rate was measured to be 0.08 micrometers/min.

As with antimony sulfide solutions, it was observed that epilayer growth begins with smooth, featureless layer surfaces, but on exceeding a certain minimum thickness, facets begin to develop on the {100} growth surface. This thickness was observed to be 9 micrometers for growth from lead sulfide solutions. The facets, as before, were seen to be bounded by {112} planes, using X-ray Laue spots. The layer thickness was 14 micrometers and some evidence of faceting was observed as shiny spots.

On completion of layer growth, as in antimony solutions, the epilayer/substrates were held for ten minutes above the melt, at the same temperature as that of the solution at withdrawal an then spun rapidly at 25 rpm. This was expected to permit any adherent solution layers to drain or roll off the epilayers under their own weight. In spite of this treatment, the mass of lead sulfide solutions adherent to the substrate was much larger than similar masses with antimony sulfide solutions. This apparently results from the much higher viscosity of lead sulfide solutions as compared with antimony solutions.

On completion of epilayer growth, as with antimony sulfide solutions, the adherent solution solidified on the epilayer surface on cooling to room temperature and was removed chemically, as described above. In general, the antimony sulfide solution residues were found to be much easier to clean chemically to obtain good layer surfaces than lead sulfide solution covered layers. These latter solution residues required long dissolution periods in the cleaning reagent. In addition, the $HNO_3$ solution was seen to attack slightly the silver thiogallate epilayer surface.

In spite of the difficulties involved in growing single crystal layers of silver thiogallate, this invention represents the first time, to the inventor's knowledge, that epilayers of high quality $AsGaS_2$ have been grown.

The following is the most preferred way of making a thin crystal of silver thiogallate. The solution is prepared by melting a solid mixture of silver thiogallate and antimony sulfide slowly at a rate of 3° to 5° C. per minute to 800° C. and maintaining this temperature for 16 hours or more. This enables the materials to mix thoroughly and form a molten solution of uniform temperature. The solution is then gradually cooled at a rate of 1° per minute to 650° C. At this temperature, a polished single crystal substrate of silver thiogallate is dipped into the molten solution. From 650° C., the solution and substrate are then cooled to 590° C. at a slow rate of 0.04° C. per minute. During this cooling, the substrate is rotated in the melt, for example, at four rpm. On cooling to 590° C., the substrate is withdrawn from the solution, at which time the thin layer of silver thiogallate has been epitaxially grown thereon. The single crystal silver thiogallate substrate is removed from the molten solution prior to the crystal thickness reaching 50 micrometers. Any residual layers of solution adhering to the crystal/substrate are then dissolved.

Electrical resistivity measurements on both the lead sulfide and antimony sulfide solution grown layers yielded resistivities of $\geq 8 \times 10^{12}$ $\Omega$-cms. Electron microprobe analysis of typical epilayers did not reveal any significant incorporation of the cationic impurities, $Sb^{3+}$ or $Pb^{2+}$ in the epilayers. If present, their concentration was less than one atomic percent. Since typically the resistivities of bulk silver thiogallate substrates are seen to be from $10^{11}$ to $10^{12}$ $\Omega$-cms, it appears that any Sb or Pb included as impurities during growth must be electrically inactive.

To gauge the overall crystalline perfection, a few typical facet-free silver thiogallate epilayers grown from antimony sulfide solutions were X-ray analyzed for rocking curve half-widths. Monochromatized $CuK_\alpha$ radiation was used to study the {040} Bragg reflection. The full width at half maximum (FWHM) for an antimony sulfide solution grown layer was 1.8 to 2 minutes of arc. For comparison, the FWHM for the best bulk grown $AgGaS_2$ single crystal substrate, similarly determined, was 3 minutes of arc. Thus, the epilayers are seen to be significantly better than the substrates in crystalline perfection. The technique for measuring the full width at half angle is described in H. P. Klug, & L. E. Alexander, *X-Ray Diffraction Procedures for Polycrystalline and Amorphous Materials,* 2nd Ed., John Wiley, New York (1974).

The above description presents the best mode contemplated for carrying out the present invention. This invention is, however, susceptible to modifications and alternate constructions from the embodiment shown in the drawing and discussed above. Consequently, it is not the intention to limit this invention to the particular embodiments disclosed. On the contrary, the intention is to cover all modifications and alternate constructions falling within the spirit and scope of the invention as expressed in the appended claims.

What is a claimed is:

1. A method of growing a single crystal layer of high purity silver thiogallate comprising the steps of:
    (a) preparing a liquid solution of silver thiogallate in a solvent selected from the group consisting of antimony sulfide and lead sulfide;
    (b) placing in the solution a seed crystal which has an appropriate lattice parameter relationship with silver thiogallate; and
    (c) slowly cooling the solution to form on the seed crystal a layer of a single crystal of silver thiogallate.

2. The method of claim 1 wherein during the growth of the crystal from an antimony sulfide solution, the solution is maintained at a temperature between about 510° C. and about 975° C. and the amount of silver thiogallate in the solution ranges between about 15 and about 95 mole %.

3. The method of claim 1 wherein during the growth of the crystal from an antimony sulfide solution, the solution is maintained at a temperature between about 600° C. and about 950° C. and the amount of silver thiogallate in the solution ranges between about 30 and about 60 mole %.

4. The method of claim 1 wherein during growth of the crystal from a lead sulfide solution, the solution is maintained at a temperature between about 750° C. and about 985° C. and the amount of silver thiogallate in the solution ranges between about 50 and about 95 mole %.

5. The method of claim 1 wherein during growth of the crystal from a lead sulfide solution, the solution is maintained at a temperature between about 810° C. and about 900° C. and the amount of silver thiogallate in the solution ranges between about 60 and about 70 mole %.

6. The method of claim 1 wherein the solution is cooled at a rate ranging between about 0.03° and about 0.5° C. per minute.

7. The method of claim 1 wherein the seed crystal is a compound selected from the group of compounds comprising a I—III—$VI_2$ chemical composition and having a substantially chalcopyrite structure.

8. The method of claim 7 wherein the seed crystal is silver thiogallate.

9. The method of claim 1 wherein the thickness of the silver thiogallate layer is less than about 50 micrometers.

10. The method of claim 9 wherein the silver thiogallate layer has a thickness ranging from about 8 to about 25 micrometers.

11. A method of growing a single crystal layer of highly pure silver thiogallate comprising the steps of:
    (a) preparing a liquid solution of silver thiogallate in a solvent selected from the group consisting of lead sulfide and antimony sulfide;
    (b) placing in the solution a seed crystal of silver thiogallate; and
    (c) slowly cooling the solution at a rate ranging between about 0.03° and about 0.5° C. per minute until there is formed on the surface of the seed crystal a layer of a single crystal of silver thiogallate having a thickness less than about 50 micrometers.

12. The method of claim 11 wherein during growth of the crystal from an antimony sulfide solution, the solution is at a temperature between about 600° C. and about 950° C. and the amount of silver thiogallate in the solution ranges between about 30 and about 60 mole %.

13. The method of claim 11 wherein during growth of the crystal from a lead sulfide solution, the solution is at a temperature between about 810° C. and about 900° C. and the amount of silver thiogallate in the solution ranges between about 60 and about 70 mole %.

14. The method of claim 11 wherein the thickness of the silver thiogallate layer ranges from about 8 to about 25 micrometers.

* * * * *